(12) United States Patent
Asanza Maldonado

(10) Patent No.: US 10,720,768 B2
(45) Date of Patent: Jul. 21, 2020

(54) ELECTRONIC CIRCUIT BREAKER

(71) Applicant: ELLENBERGER & POENSGEN GMBH, Altdorf (DE)

(72) Inventor: Diego Fernando Asanza Maldonado, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days.

(21) Appl. No.: 15/947,930

(22) Filed: Apr. 9, 2018

(65) Prior Publication Data

US 2018/0226785 A1 Aug. 9, 2018

Related U.S. Application Data

(63) Continuation of application No. PCT/EP2016/068464, filed on Aug. 2, 2016.

(30) Foreign Application Priority Data

Oct. 8, 2015 (DE) ......................... 10 2015 219 545

(51) Int. Cl.
*H02H 3/00* (2006.01)
*H02H 3/08* (2006.01)
(Continued)

(52) U.S. Cl.
CPC ................ *H02H 3/08* (2013.01); *H02H 1/04* (2013.01); *H02H 3/42* (2013.01); *H02H 9/002* (2013.01);
(Continued)

(58) Field of Classification Search
CPC ............ H02H 3/08; H02H 3/42; H02H 9/002; H02H 9/025; H02H 1/04; H03K 17/0822
(Continued)

(56) References Cited

U.S. PATENT DOCUMENTS 6,356,423 B1 3/2002 Hastings et al.
6,490,141 B2 12/2002 Fischer et al.
(Continued)

FOREIGN PATENT DOCUMENTS

CN 1713525 A 12/2005
CN 101414871 A 4/2009
(Continued)

OTHER PUBLICATIONS

International Preliminary Report on Patentability for PCT Application No. PCT/EP2016/068464 dated May 1, 2018—English translation.
(Continued)

*Primary Examiner* — Thienvu V Tran
*Assistant Examiner* — Lucy M Thomas
(74) *Attorney, Agent, or Firm* — Muncy, Geissler, Olds & Lowe, P.C.

(57) ABSTRACT

An electronic circuit breaker having a control unit and a controllable semiconductor switch which is connected in a current path between a voltage input and a load output, wherein the semiconductor switch is integrated into a voltage-controlled current source circuit, the output current of said current source circuit when the load is connected being adjusted by means of the control unit in such a way that the power of the semiconductor switch is lower than or equal to a maximum power value, and wherein the control unit outputs a setpoint value to the voltage-controlled current source circuit and receives a difference value from said voltage-controlled current source circuit, which difference value is formed from a deviation of an actual value, which represents the output current, from the setpoint value and is supplied to the semiconductor switch as a control signal for driving said semiconductor switch.

9 Claims, 3 Drawing Sheets

(51) Int. Cl.
*H02H 1/04* (2006.01)
*H02H 3/42* (2006.01)
*H02H 9/00* (2006.01)
*H02H 9/02* (2006.01)
*H03K 17/082* (2006.01)

(52) U.S. Cl.
CPC ........... *H02H 9/025* (2013.01); *H03K 17/082* (2013.01); *H03K 17/0822* (2013.01)

(58) Field of Classification Search
USPC .................................................. 361/91.1, 87
See application file for complete search history.

(56) References Cited

U.S. PATENT DOCUMENTS

| | | | |
|---|---|---|---|
| 6,839,254 | B2 | 1/2005 | Rampold et al. |
| 7,230,813 | B1 | 6/2007 | Canova et al. |
| 7,791,853 | B2 | 9/2010 | Ohshima |
| 8,350,536 | B2 | 1/2013 | Lueger |
| 10,389,110 | B2 | 8/2019 | Asanza Maldonado |
| 2003/0161082 | A1 | 8/2003 | Rampold et al. |
| 2007/0132502 | A1 | 6/2007 | Kollner et al. |
| 2011/0141643 | A1* | 6/2011 | Hummel .................. H02H 3/08 361/93.1 |
| 2011/0157752 | A1* | 6/2011 | Sakanobe .............. H02H 3/006 361/18 |
| 2016/0197602 | A1 | 7/2016 | Joos et al. |
| 2017/0098931 | A1 | 4/2017 | Gerdinand et al. |
| 2017/0170654 | A1 | 6/2017 | Asanza Maldonado |
| 2018/0226786 | A1 | 8/2018 | Fischer et al. |

FOREIGN PATENT DOCUMENTS

| | | |
|---|---|---|
| DE | 199 38 716 A1 | 2/2001 |
| DE | 200 10 283 U1 | 8/2001 |
| DE | 203 02 275 U1 | 7/2003 |
| DE | 10 2005 038 124 A1 | 2/2007 |
| DE | 10 2005 061 207 A1 | 7/2007 |
| DE | 10 2011 120 466 A1 | 6/2013 |
| DE | 10 2014 012 828 A1 | 3/2016 |
| EP | 1 150 410 A2 | 10/2001 |
| EP | 1 186 086 B1 | 12/2002 |
| EP | 1 294 069 B1 | 4/2006 |
| EP | 2 403 088 A2 | 1/2012 |
| JP | 2016226152 A | 12/2016 |
| JP | 2017527067 A | 9/2017 |
| JP | 2017529776 A | 10/2017 |
| JP | 2018130013 A | 8/2018 |
| WO | WO 2015/024754 A1 | 2/2015 |

OTHER PUBLICATIONS

Japanese Office Action dated Sep. 10, 2019 in corresponding application 2018-513882.

* cited by examiner

ELECTRONIC CIRCUIT BREAKER

This nonprovisional application is a continuation of International Application No. PCT/EP/2016/068464, which was filed on Aug. 2, 2016, and which claims priority to German Patent Application No. 10 2015 219 545.7, which was filed in Germany on Oct. 8, 2015, and which are both herein incorporated by reference.

BACKGROUND OF THE INVENTION

Field of the Invention

The present invention relates to an electronic circuit breaker having a control unit and having a controllable semiconductor switch connected in a current path between a voltage input and a load output. It additionally relates to a method for controlling an electronic circuit breaker of this nature.

Description of the Background Art

An electronic circuit breaker is described in DE 203 02 275 U1, for example. The electronic circuit breaker has a semiconductor switch in the form of a MOSFET (Metal Oxide Semiconductor Field Effect Transistor) that is connected in a current path between an operating voltage terminal and a load terminal. In order to achieve reliable current limiting in a DC network, a measured value sensed by a current sensor in the current path is fed to a comparator input of a control system. When an activation signal is present and a measured value falls below a reference value, the control system drives the semiconductor switch on, whereas in the case of a measured value exceeding the reference value, the control system drives the power transistor off and limits the current flowing through it to the reference value.

Known from EP 1 186 086 B1, which corresponds to U.S. Pat. No. 6,490,141, which is incorporated herein by reference, is a power distribution system in the low voltage range, in particular in the 24V DC range, having a number of circuits, each with an electronic circuit breaker as short circuit protection and/or overload protection. The circuits are supplied collectively by means of a clocked power supply. In the event of an overload, when an adjustable current threshold is exceeded, for example at 1.1 times the nominal current ($I_N$), a blocking of the electronic circuit breaker takes place after a delay period has elapsed, whereas in the event of a short circuit, current limiting takes place first, and then after another current threshold is exceeded (e.g., $2 \times I_N$) a blocking of the circuit breaker takes place after a specific turn-off time has elapsed.

Known from EP 1 150 410 A2, which corresponds to U.S. Pat. No. 6,356,423, is an electronic circuit breaker, driven by means of a microprocessor via a trigger circuit, that disconnects the power supply to a load with a time delay. A partial disconnection of the circuit breaker takes place beforehand or simultaneously.

A partial disconnection of an electronic circuit breaker having multiple circuit blocks, each of which has an electronic switch in the form of a MOSFET and a comparator controlling the latter through a common microprocessor, is also known from EP 1 294 069 B1, which corresponds to U.S. Pat. No. 7,230,813. In the event of an overcurrent, the power supply to the load is disconnected after a time delay that follows a partial disabling of the at least one switch.

For switching capacitive loads, in particular, and/or for protecting them from overcurrent and short-circuits, the semiconductor switch of the electronic circuit breaker is used as a constant-current source for charging the capacitance. The semiconductor switch, and in particular a MOSFET used here, must be capable of handling the power dissipation resulting from the inrush current during the switching or during the course of charging the capacitance. As a result of this situation, electronic circuit breakers, especially those with active current limiting, are usually designed with an oversize semiconductor switch (MOSFET) in order to adequately take this power dissipation into account. However, such dimensioning of the employed semiconductor switch entails an increased cost and a correspondingly large space requirement within the circuit of the electronic circuit breaker.

SUMMARY OF THE INVENTION

It is therefore an object of the present invention to provide an electronic circuit breaker that operates as effectively as possible while avoiding the said disadvantages, wherein it is desirable to avoid an oversize semiconductor switch and the costly driving thereof. Also to be specified is a suitable method for controlling (driving) such an electronic circuit breaker, in particular even during a switch-on process of a load.

According to an exemplary embodiment of the invention, the controllable semiconductor switch can be wired to form a voltage-controlled current source, which is to say that it is integrated into a corresponding voltage-controlled current source circuit. The output current thereof, when a load is connected, is set by means of a control unit such that the power of the semiconductor switch is always less than or equal to a maximum power value. The control unit sends a setpoint value for the output current to the voltage-controlled current source circuit, and receives from it a difference value produced from a deviation of the output current from the setpoint value. The difference value serves to drive the semiconductor switch and is fed to it on the control side as a control signal (control voltage).

To this end, a voltage of the voltage-controlled current source circuit representing the output current, as the actual value, and the circuit's output voltage, are appropriately supplied to the control unit. If the difference value produced in or by the voltage-controlled current source circuit deviates from a threshold value in the event of an overload or short circuit or during a switch-on to a capacitive load, this state is detected by the control unit on the basis of the difference value, and preferably a current limiting takes place initially. In addition, the control unit sets the setpoint value of the output current such that the maximum power value of the semiconductor switch is not exceeded, which is to say the switch always operates within its safe operating area (safe operation area), taking its maximum power dissipation into account.

In an embodiment, the control unit of the electronic circuit breaker sets the setpoint value of the output current in the event of an overload or short circuit, and thus also during a switch-on to a capacitive load, such that this setpoint value only rises in the event of an output voltage that likewise rises over time, taking the maximum power value of the semiconductor switch into account and starting from a minimum value. The specification of the setpoint value by the control unit of the electronic circuit breaker is suitably carried out here in discrete steps, so that the output current (load current) rises stepwise. During the phases or steps of constant output current, the control unit determines on the basis of the sensed output voltage whether or not this voltage is rising. If the output voltage is rising, the setpoint value is set to a next higher value, so that the output current likewise rises to a higher step value as well. This procedure is repeated until a maximum value is reached under the precondition of the steadily riding output voltage. Otherwise, if the output voltage does not rise, the semiconductor switch is blocked so that the electronic circuit breaker trips and disconnects the load from the current path.

In an embodiment, the voltage-controlled current source circuit of the electronic circuit breaker can have an operational amplifier operating as a comparator to the input side of which are fed the actual value representing the output current and, from the control unit, the setpoint value of the output current. On the output side, the operational amplifier is connected to an input of the control unit and also to the control side of the semiconductor switch, preferably through an amplifier circuit. The actual value fed to the input side of the operational amplifier, and also the setpoint value that is likewise fed to the input side thereof, are voltage values whose difference or difference value results in a corresponding voltage difference value at the output of the operational amplifier that is equal to or proportional to the deviation of the actual value from the setpoint value that is currently specified.

If the setpoint value is accordingly set to higher values, preferably stepwise, as a function of the present output voltage of the voltage-controlled current source circuit of the electronic circuit breaker, then as a result of the subtraction using the actual value the operational amplifier provides at its output a correspondingly rising control voltage for the semiconductor switch, so that the latter is progressively opened up (switched on), and the output current increases correspondingly, which in turn results in an increase in the actual value.

In an exemplary method for controlling the electronic circuit breaker having a semiconductor switch integrated into a voltage-controlled current source circuit, the output current, and preferably also the output voltage, of the voltage-controlled current source circuit are sensed and the power of the semiconductor switch is set to be less than or equal to a maximum power value.

Especially in the event of a short circuit, which is to say also during a switch-on process of a capacitive load, the output current preferably is initially limited to a current value. To this end, the output current of the current source circuit is suitably mirrored as the actual value that is compared with a setpoint value of the output current. From the result of the setpoint/actual comparison, a voltage difference (difference value) is determined that is used directly for driving the semiconductor switch. In the event of a threshold value deviation, the voltage difference or the corresponding difference value initially trips the current limiting. Next, the setpoint value is set as a function of the output voltage, which is to say is lowered or raised, in particular. The setting here is carried out such that firstly the power of the semiconductor switch is less than or equal to a maximum power value, and secondly the output current is only raised starting from a first current value (minimum value) if the output voltage rises over the course of time.

In other words, in the event the output current that is continually sensed as the actual value deviates from a setpoint value, a voltage difference value representing this deviation is used, on the one hand, directly to drive the semiconductor switch for the purpose of active limiting of the output current, and on the other hand to set the power of the semiconductor switch to a maximum value—taking into account the present output voltage of the voltage-controlled current source—and to limit power, if applicable, in that the setpoint value of the output current is set appropriately, which is to say changed and, if applicable, reduced.

On account of the series connection of the semiconductor switch with the connected load, the measured current value of the output current of the current source circuit that is used to set the power of the semiconductor switch, especially during a switch-on process of the electronic circuit breaker, corresponds to the load current flowing through the load that is sensed as an actual voltage value by means of a mirror circuit in the current path of the semiconductor switch and the load.

Setting the power of the semiconductor switch then can take place according to the relationship $P=U \cdot I$ using the sensed output current and the measured output voltage or load voltage, where the difference between this voltage and the given input voltage of the voltage-controlled current source circuit determines the voltage across the semiconductor, which is to say across its drain-source section. In this process, the semiconductor switch is driven such that its power (power dissipation) is always, i.e. in all operating states, less than or equal to a specific maximum power value.

The advantages achieved with the invention include, for example, in that the semiconductor switch of an electronic circuit breaker wired into a voltage-controlled current source (current source circuit) with continuous sensing of the output current always operates, in terms of power, in a safe operating area with a power (power dissipation) less than or equal to a maximum power value, for example 50 W, in all operating states, and thus even in the event of an overload or short circuit as well as during the charging process of a capacitive load.

Because of the voltage difference value of the current source circuit that arises in the event of a time-limited short circuit, in particular during the switch-on process to a capacitive load, on the one hand the output current or load current is limited by means of the semiconductor switch, and on the other hand this condition is detected by the means that the voltage difference value that is arising is sensed. In this way the setpoint value for the output current can be set such that the maximum power dissipation or power value of the semiconductor switch is within its safe operating area.

As a result of the simultaneous monitoring of the output voltage of the voltage-controlled current source circuit (current source), it is also detected whether or not this voltage rises during a specific time period. If applicable, the setpoint value of the output current can be raised while taking into account the safe operating area of the semiconductor switch in terms of power. Otherwise, a continuous overload or short-circuit condition is inferred and the turnoff of the electronic circuit breaker takes place by the output current being set to zero by means of the semiconductor switch.

With this setpoint setting, the power of the semiconductor switch is monitored in all operating states, and the semiconductor switch can be dimensioned commensurately smaller with regard to the power dissipation to be handled. In advantageous manner, the voltage-controlled current source circuit here operates such that when a PMOS field-effect transistor, for example, is used, the voltage difference value that is produced by the actual/setpoint comparison and that controls the semiconductor switch is less than zero (<0V) in normal operation. In this state the control unit can be quiescent, which is to say is correspondingly low power. Only when the voltage difference value exceeds the threshold value, or in other words is greater than, for example, zero (>0V), does the control unit react by lowering the setpoint value and sensing the output voltage, as well as raising the setpoint value for the output voltage, preferably in discrete steps, on the basis of the curve over time thereof, if the output voltage rises within a time window.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
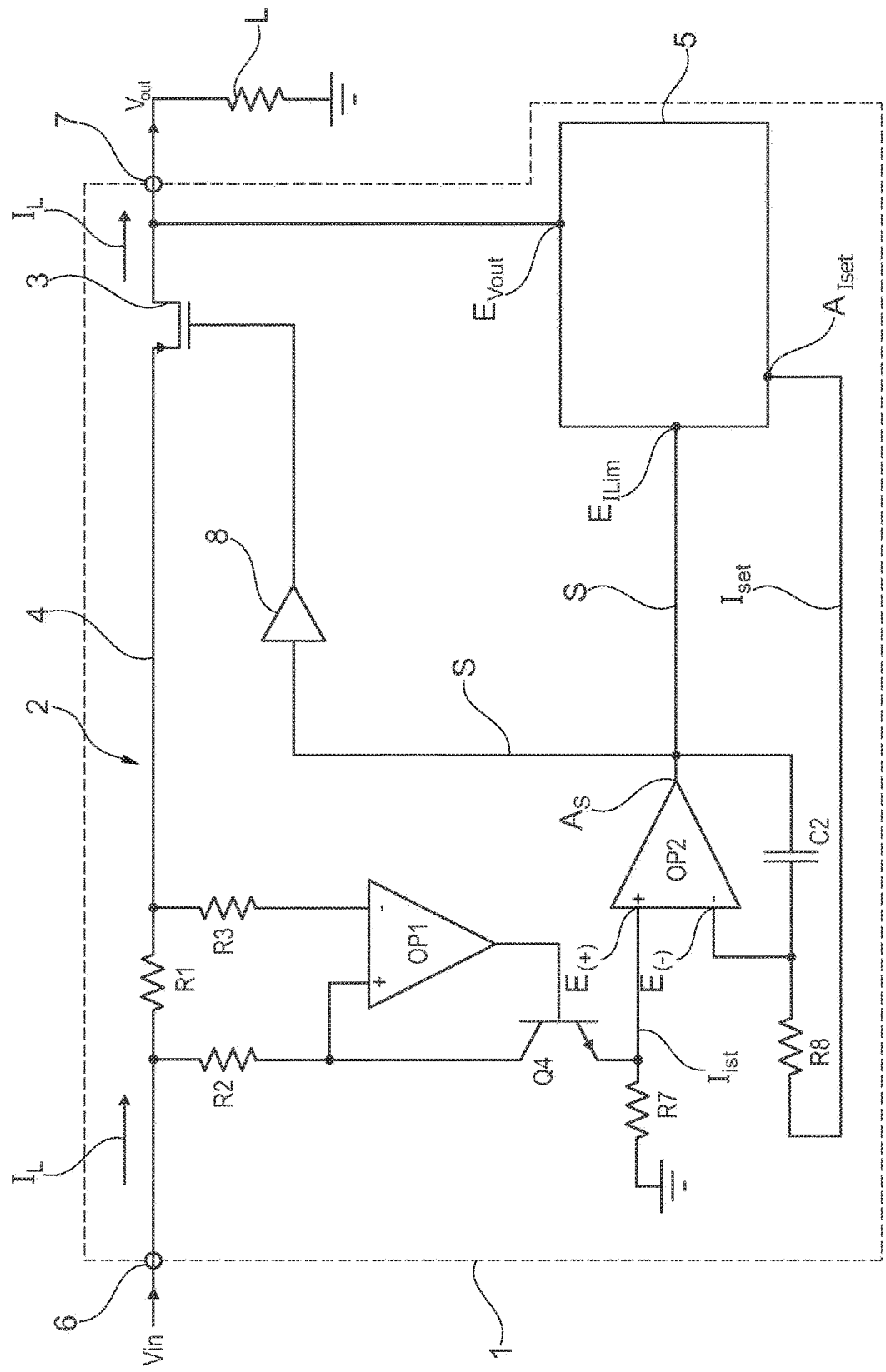
FIG. 1 illustrates, in a block diagram, an electronic circuit breaker with a controllable semiconductor switch wired in the positive current path of a voltage-controlled current source circuit, and also with a control unit or control device, for example in the form of a microprocessor, that is provided and arranged for power control of said switch.

The schematically shown electronic circuit breaker 1 includes a voltage-controlled current source 2 with a power transistor or semiconductor switch 3 in a positive current path 4 and includes a control unit or control device 5, for example in the form of a microcontroller. The current path 4 extends between an operating voltage terminal or voltage input 6 and a (positive) load terminal or load output 7. To this is connected the positive pole of a load L that is to be switched, while the negative pole thereof is routed to earth or ground. The operating voltage or input voltage $V_{in}$, in the form of, e.g., a DC voltage at 24V (DC), is applied to the voltage input 6 of the electronic circuit breaker 1. The controllable semiconductor switch 3 in the exemplary embodiment is implemented by a so-called PMOS (p-channel MOSFET or PMOSFET), which is to say a metal oxide semiconductor field-effect transistor in which positively charged charge carriers (defect electrons) are used to conduct electric current through the channel.

During operation of the circuit breaker 1 with the DC voltage source connected and load L connected, a load current starting from the voltage input 6 flows through the current path 4, and thus through the drain-source section of the semiconductor switch 3 and through the load L, to the reference potential or ground. This load current flowing through the semiconductor switch 3 and through the load L corresponds to the output current $I_L$ of the voltage-controlled current source circuit 2. The output current $I_L$ is sensed by means of the voltage-controlled current source circuit 2. To this end, the latter includes the resistors R1 to R3 and the operational amplifier OP1, as well as the transistor Q4 and the resistor R7 that is routed to ground or the reference potential, in the connection thereof shown in FIG. 1.

Using the resistors R1, R2, R3 and the operational amplifier OP1, as well as using the transistor Q4 and using the resistor R7, which is connected to ground, of the voltage-controlled current source circuit 2, a type of current mirroring occurs in that the output current $I_L$ flowing through the resistor R1 is, as it were, mirrored at the resistor R7 at a comparatively low current level. If the output current is, e.g., 1 A, then the current flowing through the resistor R7 is 1 mA, for example. The corresponding voltage value at the resistor R7 is fed to the positive input of the operational amplifier OP2 as the actual value $I_{ist}$ of the output current $I_L$.

The voltage-controlled current source circuit 2 comprises primarily an operational amplifier OP2 operating as a comparator for subtraction, to whose (positive) input $E_{(+)}$ the resistor R7, and thus the actual value $I_{ist}$ of the output current $I_L$, is routed. The inverting input $E_{(-)}$ of the operational amplifier OP2 is routed through a resistor R8 to an output $A_{Iset}$ of the control unit 5. The control unit 5 provides a setpoint value $I_{set}$ of the output current $I_L$ to the operational amplifier OP2 through the output $I_{Iset}$. A capacitor C2 is wired between the output $A_S$ and the inverting input $E_{(-)}$ of the operational amplifier OP2.

The output $A_S$ of the operational amplifier OP2 of the voltage-controlled current source circuit 2 is routed to an input $E_{ILim}$ of the control unit 5. Another input $E_{Vout}$ of the control unit 5 is routed to the current path 4 between the semiconductor switch 3 and the load terminal 7. Moreover, the output $A_S$ of the operational amplifier OP2 of the current source circuit 2 is connected to the semiconductor switch 3 on the control side, which is to say to its control input (gate). In the exemplary embodiment, this is accomplished by means of an amplifier 8 of the voltage-controlled current source circuit 2.

In the normal operating state of the electronic circuit breaker 1 and of its voltage-controlled current source circuit 2, the output $A_{Iset}$ of the control unit 5, and thus the setpoint value $I_{set}$, are set such that the output current $I_L$ preferably is greater than the maximum load current. Under these normal conditions, the load voltage or output voltage $V_{out}$ of the electronic circuit breaker 1 will be equal to its input voltage $V_{in}$.

In the event of an overload or short circuit or during a switch-on to a capacitive load L, initially the output current $I_L$ is actively limited to a nominal value $I_{Nom}$ in that the semiconductor switch 3 is driven accordingly. This state is detected by the control unit 5 because it is connected to the output $A_S$ of the operational amplifier OP2, which produces the difference between the present actual value $I_{ist}$ and the predefined setpoint value $I_{set}$, and which at its output supplies a correspondingly altered difference value S as a control signal (control voltage) for the semiconductor switch 3. This altered difference value S of the operational amplifier OP2 results in a corresponding driving of the semiconductor switch 3, so that the latter is appropriately driven off and the output current $I_L$ is limited to a current limiting value $I_{max}$. The overload or short circuit condition is also detected by the control unit 5 using the changing output voltage (load voltage) $V_{out}$.

As soon as the overload or short circuit is detected, the output current $I_L$ of the voltage-controlled current source circuit 2 is set by suitably changing the setpoint value $I_{set}$ such that the maximum power dissipation $P_{max}$ of the semiconductor switch 3 lies within its safe operating area (safe operation area). At the same time, the output voltage $V_{out}$ is monitored.

If the output voltage $V_{out}$ does not rise within a predefinable time period, the output current $I_L$ is set to zero (0 A), which is to say that the electronic circuit breaker 1 switches off the load output or load terminal 7.

In contrast, if the output voltage $V_{out}$ rises, the setpoint value $I_{set}$ is increased, preferably stepwise, within the safe operating area of the semiconductor switch 3, so that the output current $I_L$ also rises in corresponding stepwise fashion. During this process, the power, which is to say the power dissipation of the semiconductor switch 3, always remains less than or equal to a maximum power value $P_{max}$. This is accomplished by means of the control unit 5, by taking the product ($V_{out} \cdot I_{set}$) of the setpoint value $I_{set}$ and the output voltage $V_{out}$. The increase in the setpoint value $I_{set}$ within the permissible power range of the semiconductor switch 3 preferably takes place incrementally until the output voltage $V_{out}$ is again equal to the input voltage $V_{in}$ of the electronic circuit breaker 1 or its current source circuit 2.

Figure 2:
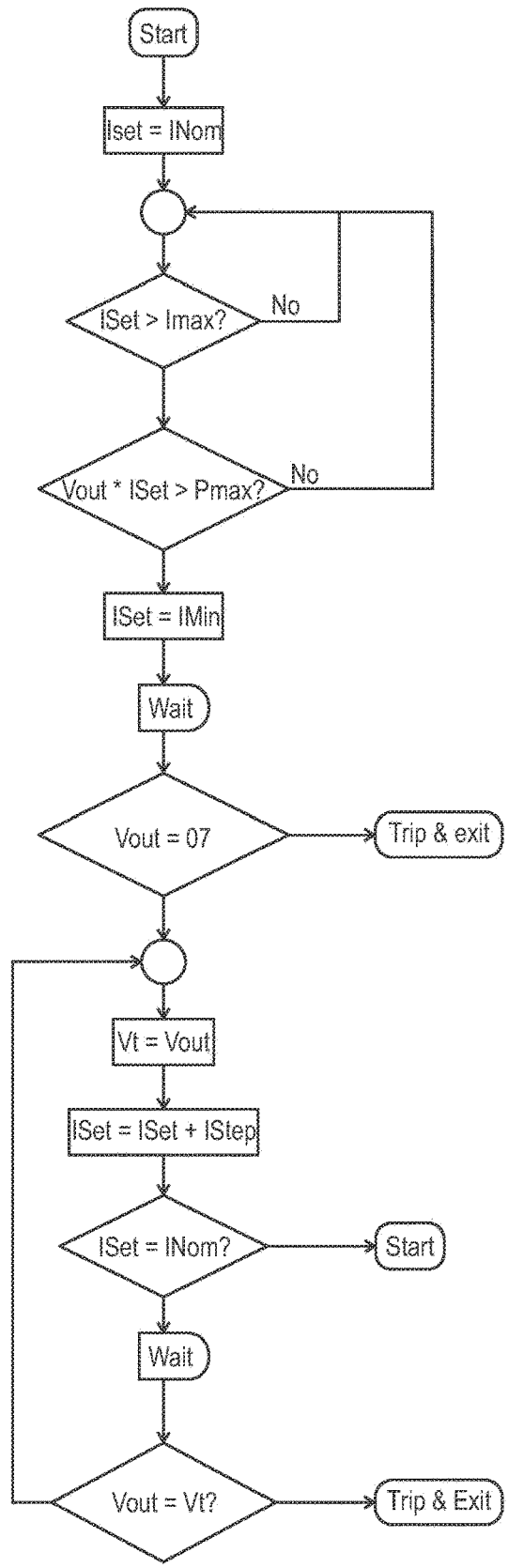
FIG. 2 illustrates, in a flow chart, a method sequence of the control method of the electronic circuit breaker.

This control method, which is suitable even for switch-on of the electronic circuit breaker 1 to a capacitive load L, in particular, is illustrated in the flow chart shown in FIG. 2. After the start, which is to say upon switch-on of the electronic circuit breaker 1, the setpoint value $I_{set}$ is set to the applicable nominal current $I_{Nom}$ by the control unit 5. This is followed by the check as to whether the setpoint value $I_{set}$ that has been set is greater than the current limiting value or maximum value $I_{max}$. If this is the case, then in the next step the product is taken of the present setpoint value $I_{set}$ and the present output voltage $V_{out}$, and a check is made as to whether this product is greater than the maximum power value $P_{max}$. If this is the case, the setpoint value $I_{set}$ is set to a minimum value $I_{Min}$. This value preferably corresponds to a fraction, for example 20%, of the nominal value $I_{Nom}$ of the output current $I_L$.

Figure 4:
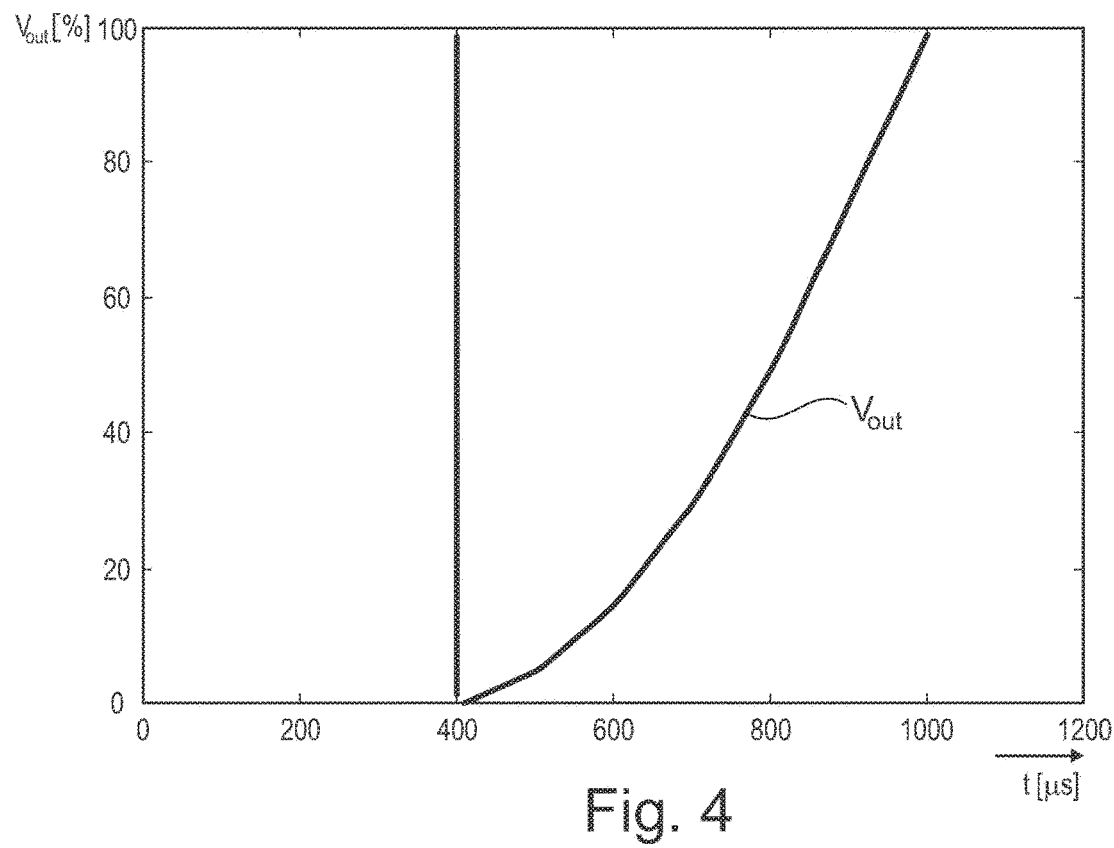
FIG. 4 illustrates, in a diagram of voltage vs. time corresponding to FIG. 3, the curve of the output voltage of the voltage-controlled current source circuit in the case of a controlled, step-like rise in the output current.

FIG. 4 shows this state using the diagram of current $I_{Nom}(t)$ vs. time, where time t in μs is plotted on the x-axis and the normalized load current or output current $I_L$ is plotted on the y-axis as nominal value $I_{Nom}$ (in %). In the initial state, the setpoint value $I_{set}$ is set to the nominal value $I_{Nom}$ of the output current $I_L$. This state is maintained as long as the setpoint value $I_{set}$ is less than the maximum value $I_{max}$ and the power ($V_{out} \cdot I_{set}$) of the semiconductor switch 3 is less than the maximum power value $P_{max}$.

The switch-on of the electronic circuit breaker 1 to the capacitive load L takes place at the time t=400. At more or less the same time, the control unit 5 sets the setpoint value $I_{set}$ of the output current $I_L$ to 20% of the nominal value $I_{Nom}$. With the lowering of the setpoint value $I_{set}$, the semiconductor switch 3 is correspondingly driven off by the operational amplifier OP2 using the difference value S. After a predefinable time period, for example with Δt=100, the response to this setting or control or regulation is sensed in that the present output voltage $V_{out}$ (t=500) is checked. If the output voltage is zero ($V_{out}=0$), then the electronic circuit breaker 1 trips. In contrast, if the output voltage is nonzero ($V_{out} \neq 0$), which is to say if the output voltage $V_{out}$ has reached a certain voltage value $V_t>0$, then the setpoint value $I_{set}$ is increased by a step value $I_{step}$, which corresponds to 30% of the normal current $I_{Nom}$, for example.

This is followed by the check as to whether the setpoint value $I_{set}$ has already reached the normal value $I_{Nom}$. If this is the case, the control algorithm starts again with the check as to whether the setpoint value $I_{set}$ corresponds to the nominal value $I_{Nom}$. If this is not the case, the program sequence is run, starting with another setpoint value increase $I_{step}$, along with a query as to the output voltage $V_{out}$ and, in particular, its rise as a result of the stepwise increase in the setpoint value $I_{set}$. If the output voltage $V_{out}$ does not exceed the voltage value $V_t$, then tripping of the electronic circuit breaker 1 takes place again.

Figure 3:
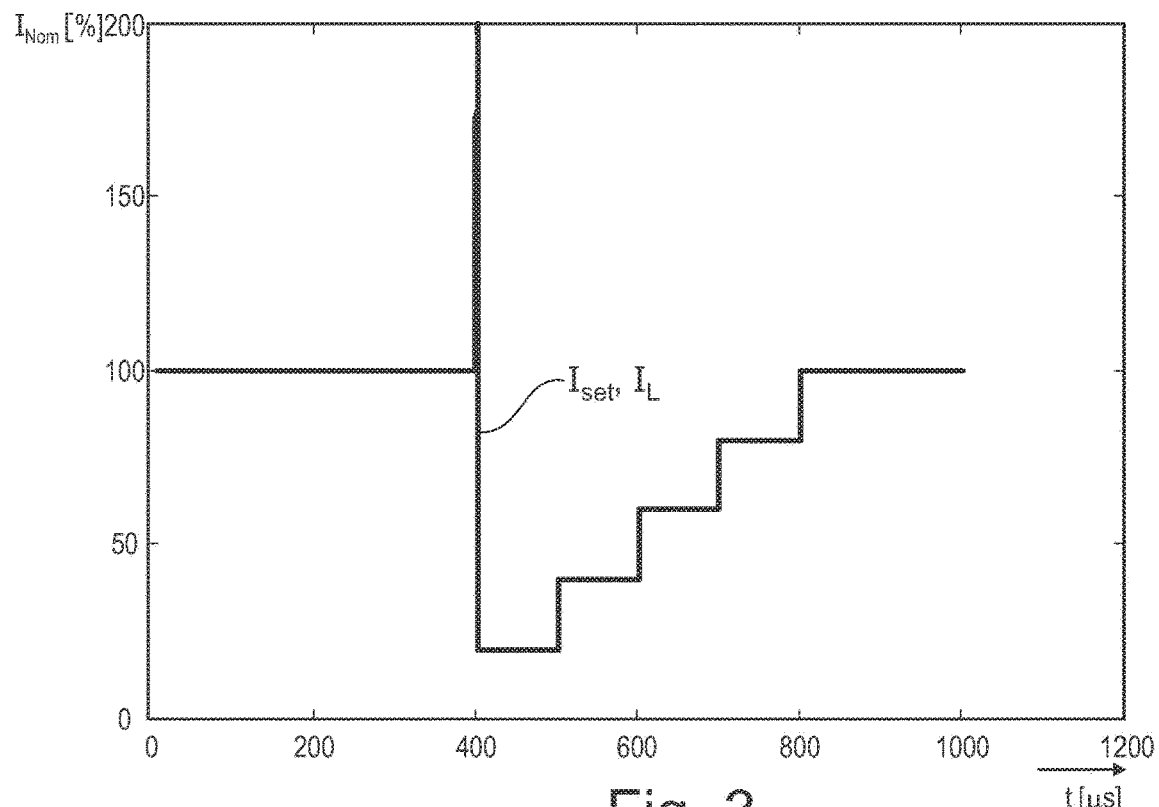
FIG. 3 illustrates, in a diagram of current vs. time, the curve of the output current (load current) of the voltage-controlled current source circuit of the electronic circuit breaker during a charging process of a capacitive load.

The relationship between the successive, preferably stepped, increase in the setpoint value $I_{set}$, and thus the output current $I_L$ on the one hand and the behavior over time of the normalized load voltage or output voltage $V_{out}(\%)$ on the other hand, is evident from the diagrams shown in FIGS. 3 and 4. Accordingly, if the output current $I_L$, and along with it the output voltage $V_{out}$ as well, rises continuously with the successive increase in the setpoint value $I_{set}$, then the setpoint value $I_{set}$ is increased until the output current $I_L$ reaches the nominal value $I_{Nom}$. The voltage curve over the time t in μs shown in FIG. 4 represents the typical case of switch-on to a capacitive load L.

By means of the method, and on the basis of the algorithm corresponding to the flowchart shown in FIG. 2, the semiconductor switch 3 can be driven within the framework of constant current limiting such that the output current or load current $I_L$ is limited at least briefly to a predefined maximum current limiting value $I_{max}$ in the event of an overload or short circuit, and such that the power dissipation of the semiconductor switch is less than or equal to the maximum power value $P_{max}$ as this takes place. The current limiting value $I_{max}$ is, for example, 1.5 to 2 times the nominal current of the circuit breaker 1.

As a result of the provision of the setpoint value $I_{set}$ by the control unit 5 to the operational amplifier OP2, and thus to the voltage-controlled current source circuit 2, the power of the semiconductor switch 3 is monitored by the control unit 5 in all operating states. In this way, the semiconductor switch 3 can be dimensioned commensurately smaller with regard to the power dissipation that must be handled.

In the case of the voltage-controlled current source circuit 2 that advantageously operates according to the exemplary embodiment with the actual/setpoint comparison using a PMOS field-effect transistor, current limiting takes place almost automatically in the event of an overload or short circuit by the means that the semiconductor switch 3 is automatically driven off when a threshold value is reached or exceeded due to the production of the difference value S at the output $A_S$ of the operational amplifier OP2. Thus, the difference value S, which is to say the voltage difference value driving the semiconductor switch 3 as a control signal, is less than zero (<0V) in normal operation. In this state the control unit 5 can be quiescent and is correspondingly low power. Only when the difference value S exceeds the threshold value $S_0$, namely $S_0=0$ V, or in other words is greater than zero, does the control unit 5 react and lower the setpoint value $I_{set}$, with the semiconductor switch 3 being driven beforehand or at the same time into current limiting with $I_L \leq I_{max}$ by means of the difference value $S \geq S_0$.

The invention is not limited to the exemplary embodiment described above. Rather, other variants of the invention can also be derived herefrom by a person skilled in the art without departing from the subject matter of the invention. In particular, moreover, all individual features described in connection with the exemplary embodiments may also be combined with one another in other ways without departing from the subject matter of the invention.

Thus, for example, a different type of MOSFET or bipolar transistor can be used as the semiconductor switch 3 in place of the PMOS transistor. In addition, the amplifier 8 can be omitted or can be constructed as an amplifier circuit.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electronic circuit breaker comprising:
   a control unit; and
   a controllable semiconductor switch connected in a current path between a voltage input and a load output, the semiconductor switch being integrated into a voltage-controlled current source circuit, an output current of which, when a load is connected, is set via the control unit such that a power of the semiconductor switch is less than or equal to a maximum power value,
   wherein the control unit sends a setpoint value to the voltage-controlled current source circuit, and receives from the voltage-controlled current source circuit a difference value that is produced from a deviation of an actual value representing the output current from the setpoint value, and is fed to the semiconductor switch as a control signal for driving the same; and
   wherein the control unit, in the event of an overload or short circuit, sets the setpoint value of the output current to a predefinable or predefined minimum value, and the predefinable or predefined minimum value increases to a nominal value when the output voltage rises over time.

2. The electronic circuit breaker according to claim 1, wherein the output voltage of the voltage-controlled current source circuit is fed to the control unit, which determines the power of the semiconductor switch from the output voltage and the setpoint value, and sets the maximum power value as a function of the output voltage.

3. The electronic circuit breaker according to claim 1, wherein the controllable semiconductor switch is driven within the voltage-controlled current source circuit such that the output current is limited in the event of an overload or short circuit, taking into account the maximum power value.

4. The electronic circuit breaker according to claim 1, wherein the control unit raises the setpoint value of the output current stepwise as a function of the output voltage.

5. The electronic circuit breaker according to claim 1, wherein the voltage-controlled current source circuit has an operational amplifier to whose input side are fed the actual value and the setpoint value of the output current, and the output side of which is connected to an input of the control unit and to the control side of the semiconductor switch.

6. A method for controlling an electronic circuit breaker having a controllable semiconductor switch integrated into a voltage-controlled current source circuit, the method comprising:
   sensing an output current of the current source circuit as an actual value and this value is compared with a setpoint value;
   producing a difference value that serves as a control signal for driving the semiconductor switch; and
   setting the setpoint value of the output current of the current source circuit such that the power of the semiconductor switch is always less than or equal to a maximum power value,
   wherein a control unit of the electronic circuit breaker, in the event of an overload or short circuit, sets the setpoint value of the output current to a predefinable or predefined minimum value, and the predefinable or predefined minimum value increases to a nominal value when the output voltage rises over time.

7. The method according to claim 6, wherein the output current is limited to a current value if the difference value of the output current produced from the actual value and the setpoint value reaches or exceeds a threshold value.

8. The method according to claim 6, wherein the output voltage of the current source circuit is sensed, and the setpoint value of the output current is set as a function of the output voltage.

9. The method according to claim 6 further comprises raising by the control unit the setpoint value of the output current stepwise as a function of the output voltage.

* * * * *